(12) United States Patent  
Duquette

(10) Patent No.: US 6,639,239 B2
(45) Date of Patent: Oct. 28, 2003

(54) ANGLE REJECTION FILTER

(75) Inventor: David W. Duquette, Minneapolis, MN (US)

(73) Assignee: CyberOptics Corporation, Golden Valley, MN (US)

( * ) Notice: Subject to any disclaimer, the term of this patent is extended or adjusted under 35 U.S.C. 154(b) by 16 days.

(21) Appl. No.: 09/954,468

(22) Filed: Sep. 17, 2001

(65) Prior Publication Data

US 2002/0070362 A1 Jun. 13, 2002

Related U.S. Application Data

(63) Continuation-in-part of application No. 09/430,713, filed on Oct. 29, 1999, now Pat. No. 6,291,830.
(60) Provisional application No. 60/106,283, filed on Oct. 30, 1998.

(51) Int. Cl.[7] ............................................. G01B 11/00
(52) U.S. Cl. .................... 250/559.3; 250/559.37; 356/612; 29/834; 702/150
(58) Field of Search ................... 250/559.12, 559.29, 250/559.3, 559.37; 356/399, 400, 612, 621, 638; 29/833, 834; 700/279; 702/150

(56) References Cited

U.S. PATENT DOCUMENTS

| 3,217,819 A | 11/1965 | Allen |
| 3,744,893 A | 7/1973 | Chandler .................... 353/75 |
| 4,521,078 A | 6/1985 | Baeger ........................ 350/334 |
| 4,615,093 A | 10/1986 | Tews et al. ................... 29/407 |
| 4,974,010 A | 11/1990 | Cleveland et al. .......... 354/403 |
| 5,218,473 A | * 6/1993 | Seddon et al. ............... 359/589 |
| 5,220,453 A | 6/1993 | McKinley et al. .......... 359/481 |
| 5,278,634 A | 1/1994 | Skunes et al. ............... 356/400 |
| 5,377,405 A | 1/1995 | Sakurai et al. ............... 29/833 |
| 5,448,406 A | 9/1995 | Billig et al. ................ 359/609 |
| 5,491,888 A | 2/1996 | Sakurai et al. ................ 29/832 |
| 5,559,727 A | 9/1996 | Deley et al. ................. 364/559 |
| 5,745,292 A | 4/1998 | Jones .......................... 359/613 |
| 5,815,272 A | 9/1998 | Harding ...................... 356/375 |
| 5,818,061 A | 10/1998 | Stern et al. ............. 250/559.29 |
| 5,871,391 A | 2/1999 | Pryor ............................. 451/9 |
| 5,897,611 A | * 4/1999 | Case et al. ................... 702/150 |
| 5,900,940 A | 5/1999 | Aoshima ..................... 356/375 |
| 5,956,149 A | 9/1999 | Suzuki et al. ............... 356/375 |
| 5,993,014 A | 11/1999 | Verebi, Jr. ................... 359/607 |
| 6,028,671 A | 2/2000 | Svetkoff et al. ............ 356/368 |

FOREIGN PATENT DOCUMENTS

| DE | 198 01 978 A1 | 7/1999 |
| DE | 199 44 721 A1 | 5/2000 |
| JP | 8-111598 | 4/1996 |
| JP | 9-210626 | 8/1997 |
| JP | 9-214198 | 8/1997 |
| JP | 9-246794 | 9/1997 |
| JP | 09-293998 | 11/1997 |
| JP | 9-307298 | 11/1997 |
| JP | 10-93298 | 4/1998 |
| JP | 10-148514 | 6/1998 |
| JP | 10-284890 | 10/1998 |
| JP | 11-251797 | 9/1999 |
| JP | 2000-31697 | 2/2000 |
| JP | 2000-13400 | 5/2000 |
| WO | WO 99/62313 | 12/1999 |
| WO | WO 00/26617 | 5/2000 |

* cited by examiner

Primary Examiner—Stephone B. Allen
(74) Attorney, Agent, or Firm—Christopher R. Christenson; Westman, Champlin & Kelly, P.A.

(57) ABSTRACT

A method and apparatus reduces undesirable glints in an optical position alignment sensor designed to orient components. Collimated light is provided onto the component. A filter is positioned behind the components and is used to block glint generated by the components. The filter is tunable by rotating it about an axis in the plane of the component.

28 Claims, 6 Drawing Sheets

ANGLE REJECTION FILTER

CROSS REFERENCE TO RELATED APPLICATIONS

This application is a continuation-in-part application of U.S. patent application Ser. No. 09/430,713 filed Oct. 29, 1999 now U.S. Pat. No. 6,291,870 entitled IMPROVED METHODS AND APPARATUS FOR CONTROLLING GLINT IN A MULTI-NOZZLE POSITION ALIGNMENT SENSOR, which application claims priority to prior provisional application No. 60/106,283 filed Oct. 30, 1998 entitled IMPROVED METHODS AND APPARATUS FOR CONTROLLING GLINT IN A MULTI-NOZZLE POSITION ALIGNMENT SENSOR; priority to these prior applications is claimed herein.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The present invention relates generally to an optical position alignment sensor for aligning electronic components, which sensor is used in the electronic component placement industry. Machines of the type used in the electronic component placement industry are sometimes called pick and place machines.

Electronic shadowing techniques incorporated in optical-based sensors are in widespread use today in pick and place machines for mounting electronic components on printed circuit boards. One of the more commonly used position alignment sensors is manufactured by CyberOptics Corporation in Golden Valley, Minn. and is sold as a LaserAlign® component alignment sensor. This sensor uses a light source focused into a stripe of light, which is typically incident on the side of an electronic component, thereby forming a shadow which is cast onto a detector. When the electronic component is rotated (by a nozzle controlled in x, y and z direction by the pick and place machine), the shadow cast on the detector changes in width.

The orientation process is generally carried out while the pick and place machine is transporting the component to a target printed circuit for placement. When the orientation process is carried out simultaneously with the transport of the component, the orientation process is sometimes referred to as an "on-head" or an "on-the-fly" measurement. Conversely, "off-head" measurements are made when the sensor is not affixed to the pick and place head but rather, is stationary relative to the head.

Current techniques are susceptible to error caused by glint. This occurs where illumination falling on a portion of the component is reflected onto the detector. This condition can lead to erroneous data and improper detection. One of the problems typically not addressed by the prior art is a position alignment sensor for aligning at least two components which prevents undesirable glints (i.e., reflections), both large and small angle, from interfering with accurately orienting either of the components.

SUMMARY OF THE INVENTION

A method of controlling glint in a position alignment sensor which aligns a component is provided. The method includes providing a stripe of light directed toward the components. The components block the light to cast shadows of the outline of the components. Some of the light is specularly reflected from the component to provide a glint. The light is then passed through a filter. The filter rejects the glint. The rejection of the filter is tuned by rotating the filter about an axis in the plane of the component. A detector is positioned beyond the filter to detect the shadows. Such a filter can be realized with a dielectric coating.

Another aspect of the invention is a position alignment sensor adapted to align components. The sensor includes a housing that accepts at least one component. A light source is located in a source plane for shining light on the component. Furthermore, the light is oriented substantially perpendicular to a central axis of each of the components so that the components block the light to form a shadow image. A glint specularly reflects off the component. A filter receives the light and allows the light to pass while rejecting the glint. The filter is tunable by rotating it about an axis in the plane of the component. A detector is positioned behind the filter.

In another aspect of the invention, two types of undesireable glints (small and large angle glints) are effectively filtered in an optical position alignment sensor and method designed to orient at least two components. The method includes shining a plurality of rays of light onto the components, the rays directed generally perpendicularly to a central axis of each of the components where each of the components clock the rays to cast a shadow of the outline of the components. Some of the rays of light are specularly reflected from one of the components to provide a large-angle glint, which is the first type of flint reduces by the present invention. The method then passes the rays of light through an optic with positive power so as to focus the two shadows at a focal point, the optic focuses an image of the shadows at a component plane located behind the focal point. An aperture is positioned substantially at the focal point and an opening in the aperture is positioned to allow the rays of light to pass therethrough except for the large-angle glint. The combination of the positive optic and the aperture prevents the large angle glint from reaching the detector. A detector is positioned in front of the component plane and a plane of the detector is positioned parallel to the plane of the optics, so that an unfocused image of the shadow falls on the detector. Additional software to differentiate between areas of differing intensities and the shapes of such areas, is needed to discern the glint from the shadow. The placement of the detector in front of the component plane separates the component shadow edge from the glint signature to suppress the effect of the small angle glint of the present invention.

DETAILED DESCRIPTION OF THE ILLUSTRATIVE EMBODIMENTS

Figure 1:
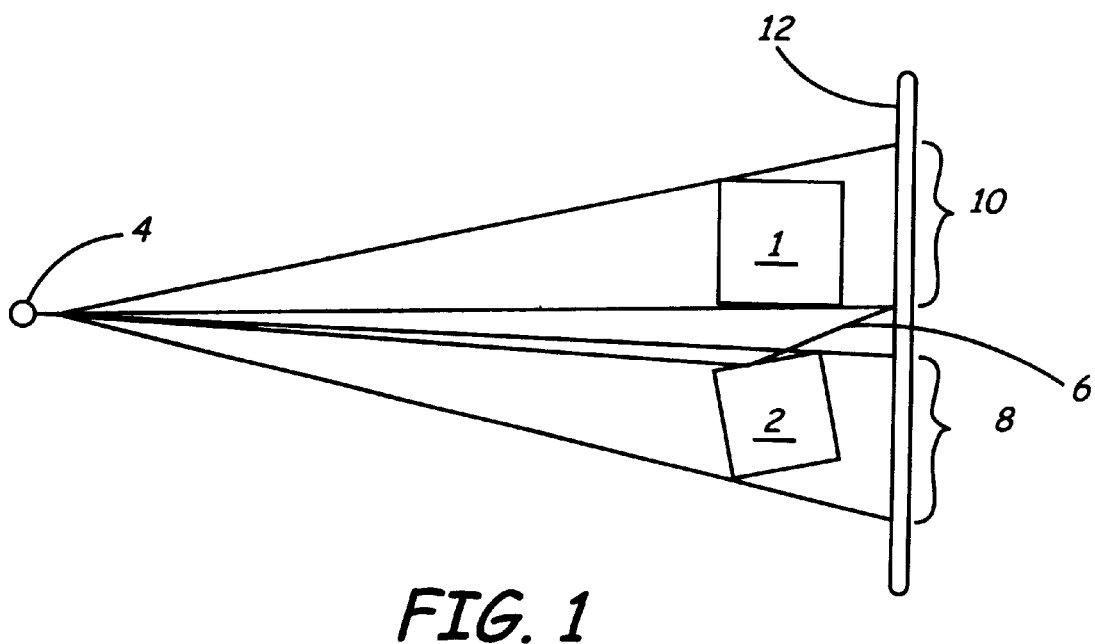
FIG. 1 shows a source of light, two components, a detector with a glint specularly reflected off of one component.

FIG. 1 illustrates the problem of glint which the present invention solves. Although embodiments of the present invention will be described with respect to two or more components, such description is provided in order to more clearly describe typically situations where glint occurs. However, those skilled in the art will recognize that embodiments of the present invention are certainly applicable to glint reduction for aligning even a single component. FIG. 1 shows a source of light 4, with rays of light incident on components 1 and 2. Each component is held in place in a sensor by a nozzle (not shown) of a pick and place machine (not shown). In the illustration, one of the rays of light specularly reflects off the edge of component 2, causing an undesirable glint 6. Components 1 and 2 each cast a shadow image 8, 10 onto a plane of a CCD detector 12. Detector 12 outputs to a set of electronics (not shown) which isolate the edges of the shadows cast onto detector 12 and send signals to motor control circuitry for the pick and place machine. The glint falls onto that portion of the detector which is receiving the shadow cast from component 1, thereby erroneously adding to the light detected by detector 12 and attributed to component 1. If the glint is located toward the outline of the shadow cast on detector 12, the electronics in the sensor may improperly assess the outline of the shadow, resulting in an incorrect assessment of the relative position of component 1.

Figure 2:
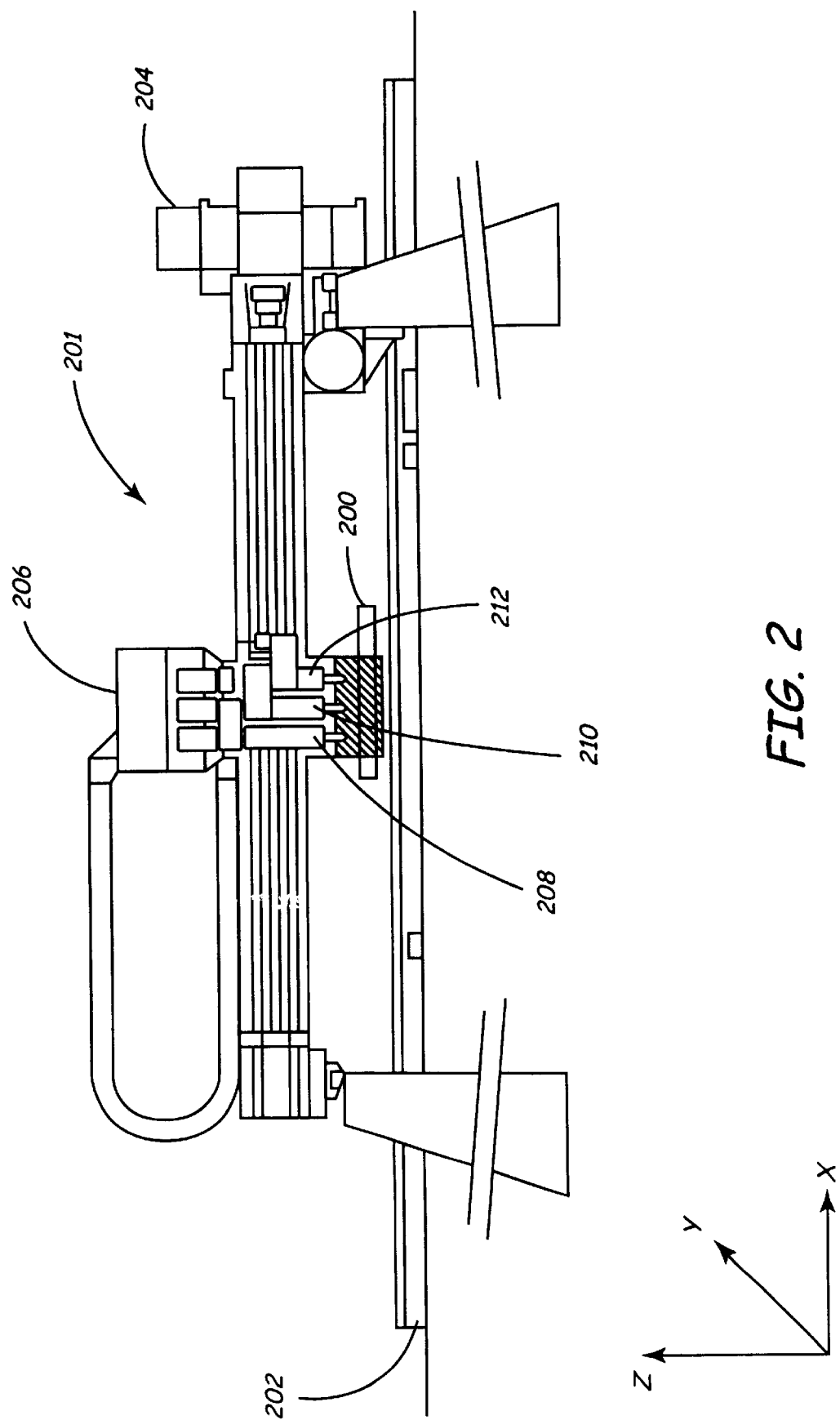
FIG. 2 shows a pick and place machine which includes a sensor of the present invention.

A multi-nozzle pick and place machine, shown generally at 201 in FIG. 2, has a conveyor system (not shown) for transporting a printed circuit board 202 into a working area. Pick and place machine 201 includes an x and y motor drive assembly at 204 for moving a vacuum head 206 independently in the x and y directions. Attached to head 206 are multiple vacuum nozzles 208,210,212 for releasably holding three components. Head 206 picks up each of the three components at trays (not shown) and while the head is transporting the components to PC board 202, a multi-nozzle alignment sensor of the present invention 200 senses the x,y and theta orientation of the components.

The pick and place machine 201 is an on-head pick and place machine, since sensor 200 senses the x,y and theta orientation of the components while head 206 transports the components to board 202. Other types of pick and place machines are equally adaptable for use with the present method and apparatus of the present invention, such as off-head pick and place machines, turret style pick and place machines or pick and place machines which have different gantry systems for moving the head in x or y directions.

Figure 3:
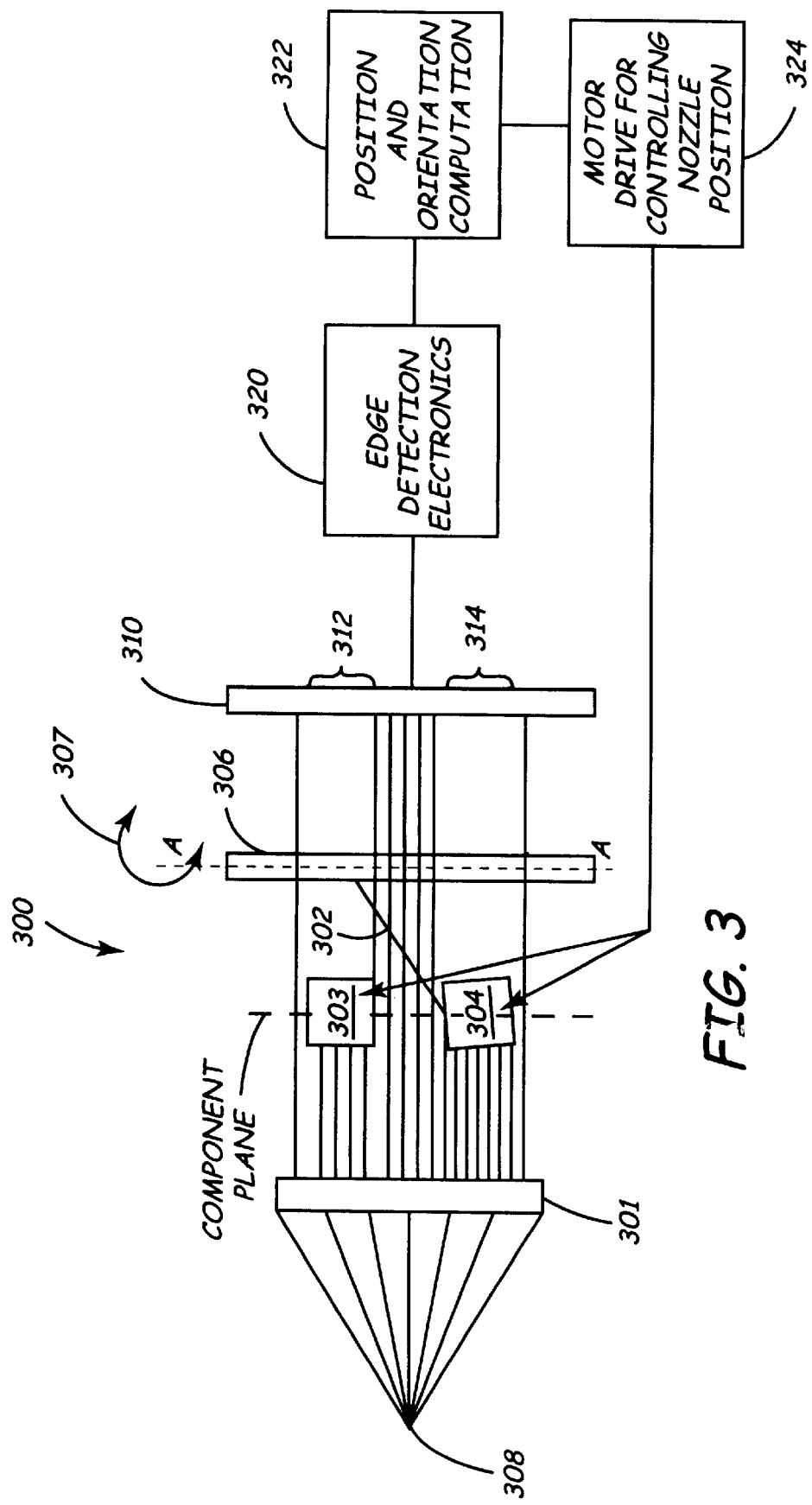
FIG. 3 shows an embodiment of the present invention, including a source of light, a collimating optic, two components, a filter and a detector.

FIG. 3 shows an embodiment of the present invention in a sensor 300 which blocks glint 302 with a combination of collimating lens 301 and filter 306. The sensor 300 of the present invention is secured onto a pick and place machine of any appropriate type, one type shown in FIG. 3. This embodiment of the present invention includes collimating lens 301 situated between light source 308 and components 303 and 304. Filter 306 is situated between components 303, 304 and detector 310. Light source 308 shines light on collimating lens 301. Collimated light then shines on components 303 and 304. An undesirable glint 302 is specularly reflected off component 304 and is now blocked by filter 306. Filter 306 is a filter that allows collimated light to pass while substantially rejecting light at angles to the collimated light. Filter 306 is preferably made of a stacked dielectric materials, to provide transmission properties that depend on angle and wavelength.

Filter 306 is rotatable along axis A—A in the directions indicated by arrow 307. The rotation of filter 306 can thus be considered about an axis in the plane of components 303, 304. Rotation of filter 306 essentially allows fine tuning of the glint angles which are rejected.

Edge detection electronics 320 detects shadows 312 and 314 cast by components 303 and 304. Although filter 306 is illustrated substantially parallel to the component plane, filter 306 may be oriented at any angle to reject light at angles to the collimated light. Alternatively, multiple filters may be used. In addition, other means for collimating light may be used besides collimating lens 304. FIG. 3 also illustrates various functions of a pick and place machine including position and orientation circuitry 322 which controls motor drive circuitry 324. Elements 320, 322 and 324 can be implemented separately or as a single circuit and can be implemented using analog to digital components or their combination.

An important variation in the embodiment shown in FIG. 3 can be realized by inserting optic 301 between components 303, 304 and the filter 307. In this way, light from source 308 would be collimated after shadow images of components 303, 304 were formed.

Figure 4:
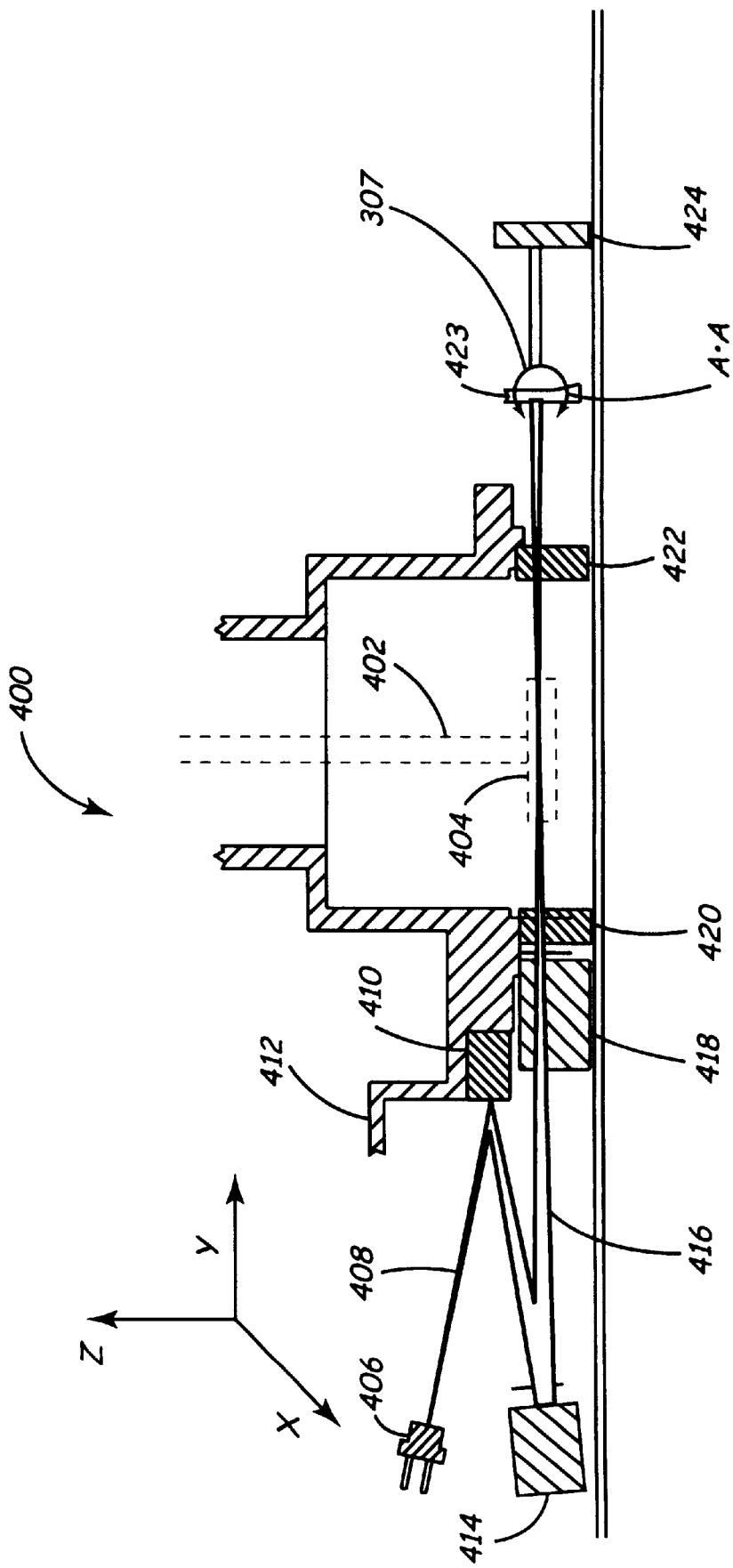
FIG. 4 shows a further embodiment of the present invention in a sensor housing suitable for mounting in a pick and place machine.
Figure 5:
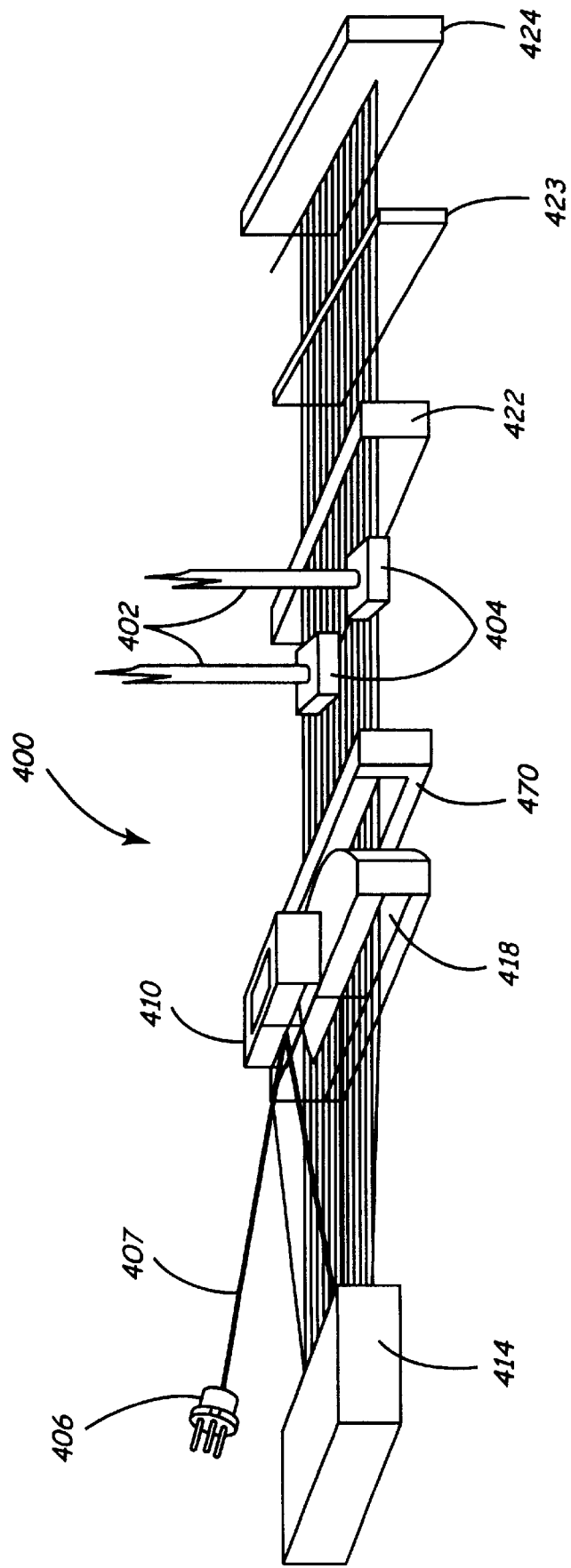
FIG. 5 shows the embodiment in FIG. 4 in a perspective drawing.

FIG. 4 is a side cross-sectional view and FIG. 5 is a perspective view of a sensor 400 in accordance with one embodiment which implements aspects of the invention.

In FIG. 4, a sensor 400 is adapted to receive multiple nozzles 402 with components 404 on their respective ends. A laser diode 406 source emits light 408, which is reflected off of a flat mirror 410 located inside the housing 412 of the sensor 400. The mirror 410 directs the light to a second mirror 414, which re-directs the light as shown and also narrows the light in the z dimension to make a ribbon (stripe) of light 416. The stripe 416 is then passed through a cylindrical collimating lens 418 so that all the rays of light are substantially parallel in the x-y plane. The ribbon of light 416 passes through a window 420 and enters the cavity, impinging on the edge of the components 404. The light which is not blocked by the components 404 now passes through another window 422 in the housing 412. The light then shines on filter 423. As in the previous embodiment, filter 423 rejects light at angles to the collimated light while allowing collimated light to pass through and fall on linear detector 424. Filter 423 is tunable by rotating it about axis A—A as indicated by arrow 307. Although the present invention is implemented with a linear detector 424 for economic reasons, the present invention may also be practiced with an area array as appropriate.

Figure 6:
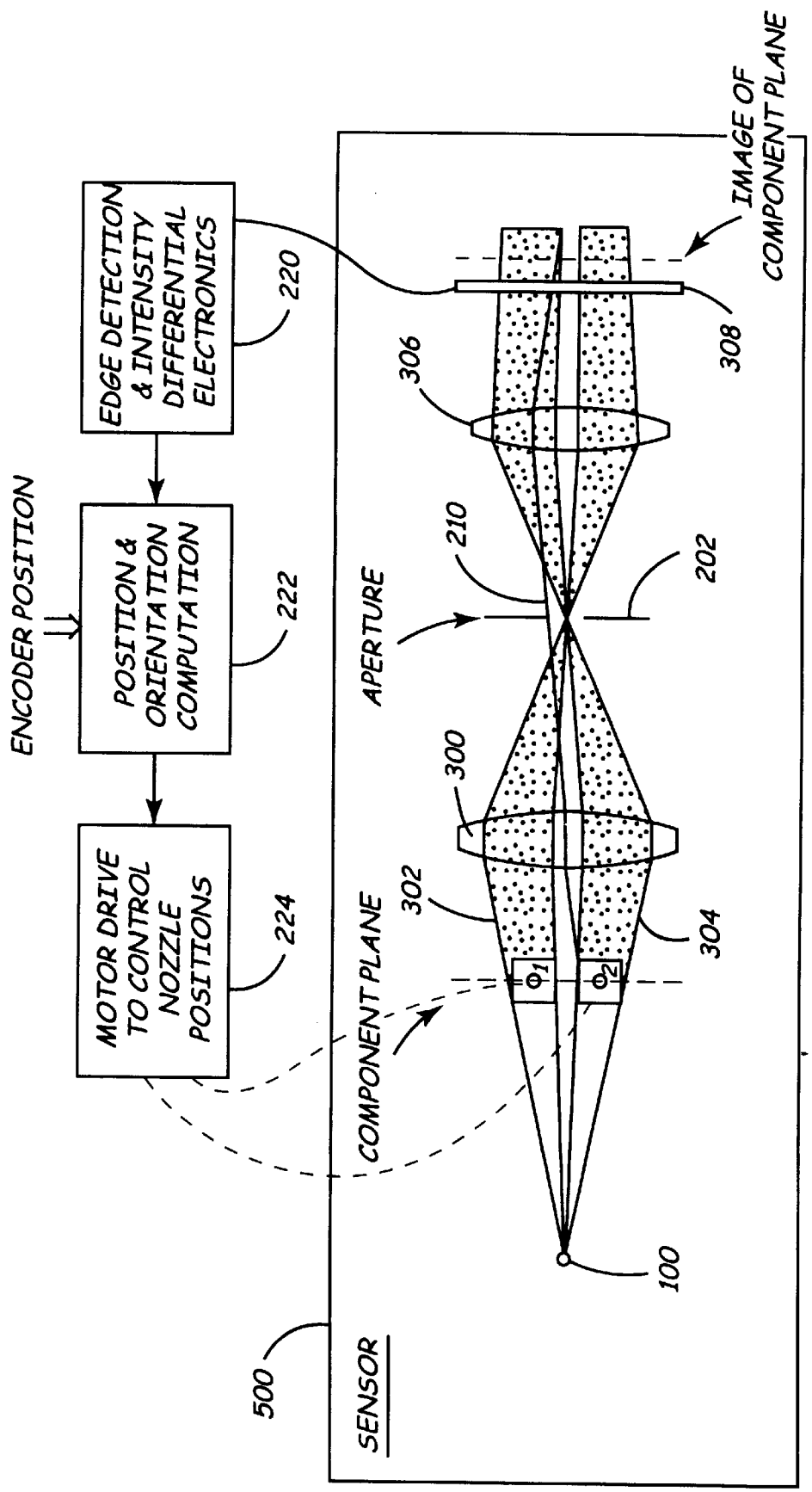
FIG. 6 is another embodiment of the invention, including a source of light and two components, a positive optic, an aperture, a collimating optic and a detector, where the plane of the detector is in front of the images of the shadows from the components.

FIG. 6 is a top plan view of an apparatus, in accordance with an embodiment of the invention, for determining the position and orientation of components to be placed. Apparatus 500 includes many components that are similar to the embodiment described with respect to FIG. 5 in the parent application, and like components are numbered similarly. One significant difference between FIG. 5 in the parent application and this FIG. 6 is that detector 308 is now positioned in front of the image of the component plane. Even though the glint falls within the shadow, the software and electronics in block 220 discern the difference between the light formed by the shadow of components 1, 2, and the glint 210 on the basis of the differences in their respective intensities and shape of the areas representing differing intensities. This configuration provides for a more compact sensor than the embodiment shown in FIG. 5 of the parent application, but requires additional code to discern the glint light from the shadow light.

The present invention as shown in varying embodiments herein, is also shown herein within one housing. In practice, it may be advantageous to have two or more housings for practicing the method of the present invention, such as a separate housing for the light source.

All the presently described sensors for aligning components are shown with a single source. However, the method and apparatus of the present invention are not limited to a single source embodiment of position alignment sensors, but is understood to cover ones with multiple effective light sources. For example, the point source shown in FIG. 6 may be implemented with an equivalent non-point source of light and optics. Furthermore, the present invention may be practiced regardless of the relative motion of the components or their placement within the sensor cavity. In other words, one may practice the present invention and rotate as many nozzles as desired with any relative placement of the nozzles. Furthermore, the present invention is disclosed with lenses, but may be implemented with equivalent optical components, such as curved mirrors or the like. For example, the positive optic described in some of the embodiments herein may be realized by combinations of other optics which perform substantially the same function. Although the present invention has been described in terms of determining the width of a shadow, the invention can be used with any application which determines shadow edge position of at least two components and is affected by glint. Furthermore, the term "light" as used herein includes non-visible radiation. Although the present invention has been described with reference to preferred embodiments, workers skilled in the art will recognize that changes can be made in form and detail without departing from the spirit and scope of the invention.

What is claimed is:

1. A method of controlling glint in a position alignment sensor, the method comprising:
   providing a collimated stripe of light directed toward at least one component;
   projecting the light onto the at least one component, the component blocking the light to cast a shadow of the outline of the component, some of the light specularly reflected from the component to provide a glint;
   passing the light through a filter, the filter further rejecting the glint;
   rotating the filter about an axis in the plane of the component to tune the filter's angular rejection; and
   positioning a detector beyond the filter to detect the shadow.

2. The method of claim 1 wherein positioning the detector includes positioning the detector substantially perpendicular to a direction of the light.

3. The method of claim 1 including rotating the component around its central axes until a cusp representative of the shadow outline is located.

4. The method of claim 1 including aligning an additional component illuminated by the light.

5. The method of claim 1 wherein shining light comprises providing substantially parallel rays of light in a vicinity of the component.

6. The method of claim 1 wherein positioning the detector includes positioning the filter substantially perpendicular to a direction of the light.

7. A method of reducing glint in a position alignment sensor, the method comprising:
   shining rays of light onto at least one component from a source, at least some of the light specularly reflected off the at least one component to provide a glint, the component blocking some of the light to form a shadow image of each of the at least one component;
   adjusting a filter by rotating the filter in an axis in a plane of the at least one component; and
   passing the rays through the filter, the filter further rejecting the glint.

8. The method of claim 7 further comprising the step of collimating the rays of light before the shadow image is formed.

9. The method of claim 7 further comprising the step of collimating the rays of light after the shadow image is formed.

10. The method of claim 7 including positioning a detector to detect the rays.

11. The method of claim 7 including rotating the component around its central axes until a cusp representative of the shadow outline is located.

12. The method of claim 7 wherein the filter is placed in a plane substantially perpendicular to the rays of light.

13. The method of claim 7 wherein the filter is angled with respect to a plane substantially perpendicular to the rays of light.

14. A position alignment sensor comprising:
   a housing adapted to accept at least one component;
   a light source disposed to shine light on the at least one component, the light oriented substantially perpendicular to a central axis of each of the component, so that the component blocks the light to form a shadow image, a glint specularly reflected off of the component;
   a tunable filter receiving the light and allowing the light to pass while rejecting the glint; and
   a detector positioned behind the filter.

15. The position alignment sensor of claim 14 further comprising an optic for collimating light the optic positioned in front of the at least one component.

16. The position alignment sensor of claim 14 further comprising an optic for collimating light, the optic positioned behind the at least one component.

17. The sensor of claim 14 wherein the tunable filter is rotatable in an axis in a plane of the component.

18. The sensor of claim 14 wherein the light source provides substantially parallel rays of light in a vicinity of the component.

19. A position alignment sensor adapted to align at least two components, the apparatus comprising:
   a source of illumination for shining rays of illumination on the at least two components, the rays oriented perpendicularly to a central axis of each of the components so that the components block the rays to form respective shadow images, a glint being specularly reflected off one of the components;
   an optic with positive power adapted to receive the shadow images and glint, the optic redirecting the shadow images and glint to converging paths that would converge upon a focal point; and
   a detector positioned a distance away from the focal point to receive the converging shadow images and glint at different portions of the detector so that the glint does not overlap any of the shadow images.

20. The position alignment sensor of claim 19 where the detector is positioned in front of the focal point.

21. The position alignment sensor of claim 19 where the detector is positioned behind the focal point.

22. The position alignment sensor of claim 19 where the source of the illumination is substantially a point source.

23. A method for aligning at least two components, comprising:

a shining light on to the at least two components to form shadow images, a glint specularly reflecting off one of the components;

passing the light and the glint through a positive optic so as to redirect the shadow images and glint to converging paths which would converge to a focal point; and detecting the converging shadow images on a detector positioned a distance away from the focal point.

24. The method of claim 23 where the detector is positioned in front of the focal point.

25. The method of claim 23 where the detector is positioned behind the focal point.

26. A method of reducing glint in a position alignment sensor which aligns at least two components, the method comprising:

shining light onto the at least two components from a source, the source located in a source plane and the components located in a component plane, at least some of the light specularly reflected off one of the components to provide a large-angle glint, the components blocking some of the light to form a shadow image of each of the at least two components;

passing the shadow images through an optic with positive power to provide focused shadow images of each of the at least two components focused at a common focal point, the optic additionally passing the large-angle glint;

passing the rays through an opening in an aperture, the aperture positioned at the focal point, the opening in the aperture having a size to block the large-angle glint; and detecting the shadow images on a detector positioned a distance away from a component image plane.

27. The method of claim 26 where the detector is positioned in front of the component image plane.

28. The method of claim 26 where the detector is positioned behind the component image plane.

* * * * *